(12) United States Patent
Costa et al.

(10) Patent No.: US 7,164,318 B2
(45) Date of Patent: *Jan. 16, 2007

(54) CONTINUOUS VARIABLE-GAIN LOW-NOISE AMPLIFIER

(75) Inventors: Damian Costa, San Diego, CA (US); Joseph Austin, San Diego, CA (US); John Groe, Poway, CA (US); Michael Farias, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/928,713

(22) Filed: Aug. 26, 2004

(65) Prior Publication Data

US 2005/0134385 A1   Jun. 23, 2005

Related U.S. Application Data

(63) Continuation of application No. 10/139,141, filed on May 3, 2002, now Pat. No. 6,801,089.

(60) Provisional application No. 60/289,047, filed on May 4, 2001.

(51) Int. Cl.
  *H03G 3/30* (2006.01)
(52) U.S. Cl. .................. 330/283; 330/100; 330/278; 330/311
(58) Field of Classification Search .............. None
  See application file for complete search history.

(56) References Cited

U.S. PATENT DOCUMENTS 5,999,056 A * 12/1999 Fong .................. 330/278
6,211,737 B1 * 4/2001 Fong .................. 330/282
6,255,889 B1 * 7/2001 Branson .............. 327/359

OTHER PUBLICATIONS

W.R. Davie and J.E. Solomon, "A High Performance Monolithic IF Amplifier Incorporating Electronic Gain Control" ISSCC Symposium, pp. 118-119, Feb. 16, 1968, Univ. Pennsylvania.
K. Fong, Dual-Band High-Linearity Variable Gain Low-Noise Amplifiers for Wireless Applications, ISSCC Symposium, (pp. 194-195, 224-225, 463), Feb. 1999.
Josef Fenk, "RF IC Design for Wireless Communication Systems", Monterey, CA, 33-35, May 12-16, 1997.

* cited by examiner

*Primary Examiner*—Khanh Van Nguyen
(74) *Attorney, Agent, or Firm*—Daniel Tagliaferri, Esq.; Cooley Godward Kronish LLP

(57) ABSTRACT

Continuous variable-gain low-noise amplifier. The amplifier continuously adjusts its gain between well-defined high and low values by using a cascode current-steering circuit to partition signal current between two different nodes of an output loading network. A shunt feedback network connected from an intermediate node of the loading network to the input provides negative feedback that linearizes the amplifier as its gain is decreased. The circuit degrades the noise figure at lower gains by varying the gain without directly dumping the signal current to the power supply. The circuit produces only small changes in input and output impedances and preserves an improved reverse-isolation cascode characteristic as the gain is controlled.

10 Claims, 2 Drawing Sheets

CONTINUOUS VARIABLE-GAIN LOW-NOISE AMPLIFIER

CROSS REFERENCE TO RELATED APPLICATIONS

This Application is a Continuation of U.S. patent application Ser. No. 10/139,141 filed on May 3, 2002 now U.S. Pat. No. 6,801,089. The application Ser. No. 10/139,141 claims the benefit of priority from a U.S. Provisional Application entitled "CONTINUOUS VARIABLE-GAIN LOW-NOISE AMPLIFIER" Ser. No. 60/289,047 filed on May 4, 2001, the disclosure of which is incorporated by reference herein in its entirety for all purposes.

FIELD OF THE INVENTION

This invention relates generally to low-noise amplifiers (LNAs), and more particularly, to an LNA that varies gain continuously with respect to a control voltage.

BACKGROUND OF THE INVENTION

Variable gain amplifiers (VGAS) are frequently used in modern radio receivers to amplify or attenuate incoming signals to properly drive an associated analog-to-digital converter (A/D). Typically, the variable gain is distributed among radio frequency (RF), intermediate frequency (IF), and low-frequency or baseband circuits. Because the RF front-end low noise amplifier (LNA) must detect weak signals in the presence of strong interfering signals, it must have both a low noise figure, to increase the sensitivity of the receiver, and high linearity to prevent interference from unwanted adjacent channel signals. As the desired input signal strength rises above sensitivity, reducing the LNA gain increases the dynamic range of the receiver and eases the linearity requirements of the downconverting mixer and following stages in the receiver chain.

Several types of LNA architectures have been used in an effort to meet the performance requirements of modern radio receivers. For example, in some typical LNA architectures, the LNA gain control has conventionally been implemented in discrete steps. In it's most basic form, a step-gain LNA consists of two amplifiers in parallel, one having the desired low noise and high gain and the other having the desired low gain and high input overload capability. However, one significant problem associated with this implementation is that high noise levels are experienced at low gain.

Additionally, step-gain LNAs have several other drawbacks. First, because the step LNA does not provide for a smooth transition between gain states, it does not allow the optimization of the operating characteristics of the overall system under all operating conditions. With the LNA in a given fixed-gain state, as the input power is increased, the linearity of the following stages is used up. To prevent the system from falling out of operating specifications before the LNA is switched to its next gain state, sufficient margin, at the expense of increased current consumption, must be added to the linearity of the following stages. Second, the gain of the LNA and the IF VGA must be controlled in a seamless fashion. In some wireless communications systems, such as Code Division Multiple Access (CDMA), the gain of the IF VGA is adjusted continuously by an analog control voltage. With a multi-step LNA, separate digital control signals as well as circuitry to generate the required switching hystersis characteristic are needed, which add complexity and consume additional chip area. Third, a step-gain LNA introduces transient glitches during gain switching that could possibly distort the amplitude and phase of the signal waveform.

One way to address the problems associated with the step-gain LNA is to use a continuously variable gain LNA. An LNA with continuously variable gain overcomes the aforementioned shortcomings since it may allow the performance of the following stages to be made close to the minimum required specifications, can be controlled with the same AGC control voltage as used with the IF VGA, and minimizes the generation of transients as the gain is varied. A number of IF amplifiers with continuous gain control have been developed. However, conventional circuits of this type suffer from two well-known disadvantages. First, under high attenuation (when a large overload capability is required in a receiver) the amplifier's linearity is severely reduced. Second, similarly to the current-splitting step LNA, the noise figure of the continuous current-splitting amplifier degrades significantly at low gains, because in these circuits most of the signal current has been dumped to the power supply.

Accordingly, a need remains for a continuous variable-gain LNA that overcomes the disadvantages of current techniques, while meeting all the stringent performance requirements of an LNA for use in a modem radio receiver.

SUMMARY OF THE INVENTION

This present invention includes an LNA with continuously variable gain. In one embodiment, the gain of the LNA can be gradually adjusted between well-defined minimum and maximum values by controlling the amount of signal current that is steered to an intermediate node of an impedance network connected to the output. The amplifier consists of an input inductively degenerated transconductance stage driving a cascode current-steering circuit that is coupled to an output-loading network. A shunt feedback network from the intermediate node of the output-loading network to the input, linearizes the amplifier as the gain is reduced. The gain control of the circuit according to the invention is continuous rather than discrete. The noise figure of the circuit included in the present invention is excellent at low gains. A further advantage of the circuit included in the present invention is that it achieves excellent linearity as the gain is reduced. Another aspect of the amplifier included in the present invention is that it produces relatively small changes in input and output impedance as the gain is varied. A further aspect of the present invention is that the cascode circuit allows improved reverse isolation.

In one embodiment included in the present invention, an amplifier is provided that comprises an input inductively degenerated transconductance stage that is coupled to a current-steering circuit. The amplifier also comprises an output-loading network coupled to the current steering circuit, and a shunt feedback network coupled between the output-loading network and the transconductance stage.

In another embodiment included in the present invention, a continuously variable-gain LNA is provided that comprises a transconductance stage having an input to receive an input signal to be amplified. The LNA also comprises a current steering circuit coupled to the transconductance stage, and an output circuit coupled to the current steering circuit and having an output to output an amplified version of the input signal. The LNA also comprises a feedback circuit coupled between the output circuit and the input of the transconductance stage.

BRIEF DESCRIPTION OF THE DRAWINGS

The foregoing and other objects, features, and advantages of the invention will become more apparent with reference to the following detailed description and accompanying drawings wherein.

DETAILED DESCRIPTION

Figure 1:
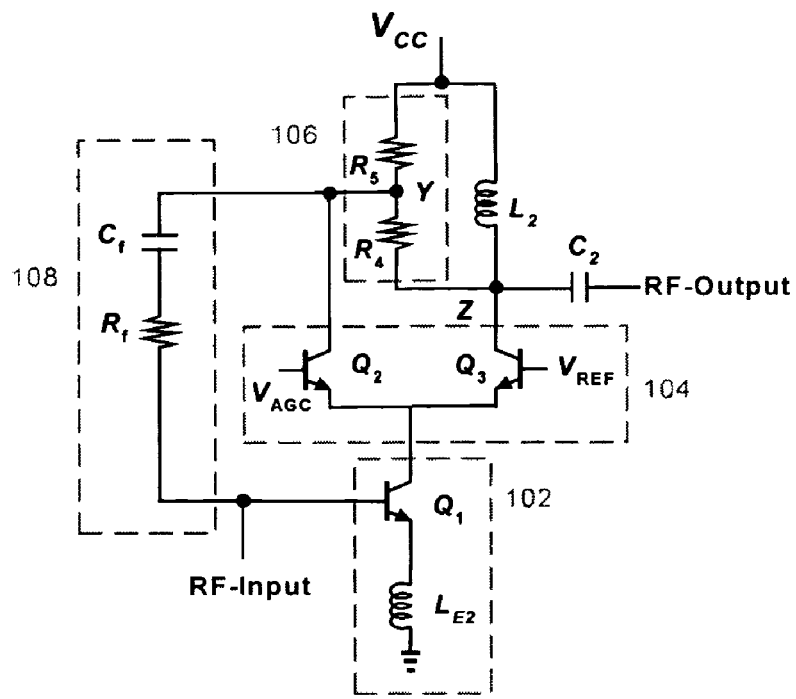
FIG. 1 shows a circuit schematic of a continuous variable-gain LNA constructed in accordance with the present invention.

FIG. 1 shows a circuit schematic of a continuous variable-gain LNA constructed in accordance with one embodiment of the present invention. The circuit of FIG. 1 includes an input transconductance stage 102, a current-steering circuit 104, and an output load network 106. The input stage consists of an inductively degenerated common-emitter transistor $Q_1$ with its collector connected to the emitters of $Q_2$ and $Q_3$, which form the cascode current steering circuit. The output load network consists of resistors $R_4$ and $R_5$ connected in series between the supply voltage $V_{CC}$ and node Z. Transistors $Q_2$ and $Q_3$ are arranged in a common-base configuration with the collectors of $Q_2$ and $Q_3$ tied to output load network nodes Y and Z, respectively. The base of transistor $Q_3$ is connected to a reference voltage $V_{REF}$, while the base of $Q_2$ is connected to the gain control voltage $V_{AGC}$. A shunt feedback network 108 is connected from node Y of the load network to the base of the input stage transistor $Q_1$. The output network 106 is also coupled to an inductor $L_2$ in parallel with the series combination of $R_4$ and $R_5$ and a series capacitor $C_2$. The components $L_2$ and $C_2$ are used to match the output impedance to an external load and can be realized either as on-chip or external components.

In operation, an RF input signal is applied at the base of transistor $Q_1$, which converts the input voltage to a current. Cascode transistors $Q_2$ and $Q_3$, acting as both a current-steering circuit and common-base amplifiers, route the signal current at the collector of $Q_1$ to either node Y or node Z of the load network. When the control signal $V_{AGC}$ is sufficiently low compared to $V_{REF}$ so that $Q_3$ turns on completely and $Q_2$ turns fully off, the amplifier achieves its highest gain because all of the signal current from $Q_1$ flows through $Q_3$ and is injected at node Z, which has the highest possible resistance, $(R_4+R_5)$. For example, $V_{AGC}$ and $V_{REF}$ are generated by known techniques to achieve a desired gain characteristic and compensate for temperature effects. The lowest gain is achieved by setting $V_{AGC}$ high enough compared to $V_{REF}$ so that $Q_1$ turns off and $Q_2$ turns on. All of the signal current from $Q_1$ flows through $Q_2$ and is routed to node Y of the loading network which attenuates the output signal compared to high gain by the ratio $R_5/(R_4+R_5)$. In one embodiment, $R_4$ is nine times larger than $R_5$ so that the gain change between high gain and low gain is 20 dB. Intermediate gain values are achieved by partitioning the amount of signal current from the transconductance stage that is steered to node Y relative to that routed to node Z. In one embodiment, $(R_4+R_5)$ is approximately 500 ohms.

To compensate for the nonlinear components in the output current as the signal current is steered and the LNA gain is reduced, the shunt feedback network 108 is connected between node Y of the loading network and the base of the input transistor $Q_1$. The shunt feedback network is comprised of feedback resistor $R_f$ and a feedback capacitor $C_f$ (which typically only acts as a dc blocking capacitor). The shunt feedback network senses the voltage at node Y and returns a proportional current to the base of $Q_1$, which tends to offset the nonlinearities of the amplifier gain response. The influence of the shunt feedback network can be readily seen from the expression for the small-signal voltage gain of the LNA. For frequencies $<<f_T$, (unity gain cut-off frequency) the magnitude of the small-signal voltage gain of the intrinsic amplifier $(a_v)$ in FIG. 1 (i.e., neglecting voltage transformations across input (not shown) and output matching networks ($L_2$ and $C_2$)), can be approximated as $$|a_v| \approx g_{m13}\left[\frac{g_{m15}}{g_{m14}+g_{m15}}(R_5+R_4)+\frac{g_{m14}}{g_{m14}+g_{m15}}R_5-\frac{R_5^2}{R_f+R_5}\right]$$

The first two terms describe the variation in gain as the collector current of $Q_1$ is partitioned between transistors $Q_3$ and $Q_2$ and accordingly produces output voltages across resistances $R_4+R_5$ and $R_5$, respectively. Without any shunt feedback ($R_f=\infty$), the high gain becomes $g_{m1}(R_4+R_5)$ because $g_{m2}=0$ when all the current is routed through $Q_3$ to node Z. Likewise, the low gain becomes $g_{m1}R_5$ because $g_{m3}=0$ when all the current is diverted through $Q_2$ to node Y. The third term in above equation reflects the presence of negative feedback, which reduces the small-signal gain and also linearizes the amplifier gain response.

Figure 2:
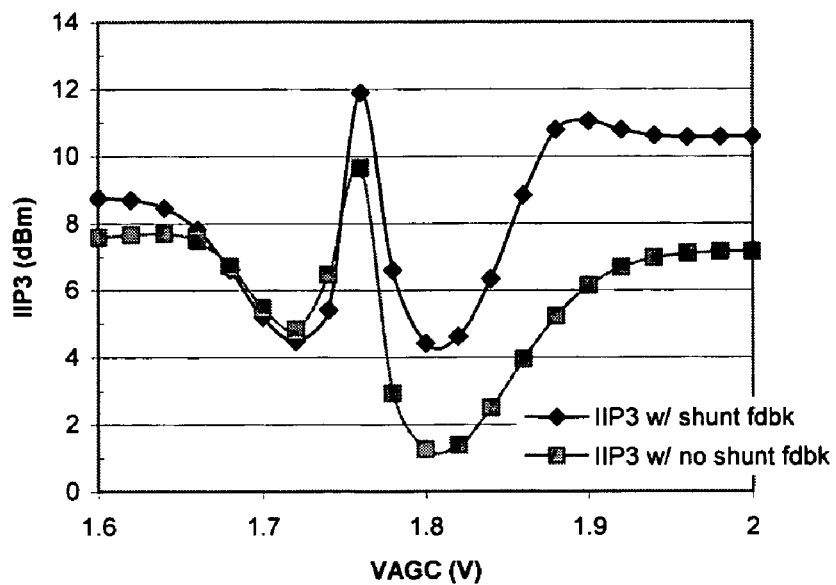
FIG. 2 shows a graph comparing the input third-order intercept point versus gain control voltage of the variable-gain LNA of FIG. 1, with and without shunt feedback.

FIG. 2 is a graph providing a comparison of the input third-order intercept point (IIP$_3$) versus $V_{AGC}$ of the amplifier according to the invention, with and without shunt feedback. The graph was created with input signal tones at $f_1=1.99$ GHz and $f_2=2$ GHz, $V_{REF}=1.75$V, and with values of $R_f=500$ ohms and $R_f=2$ pF in the case when shunt feedback was applied. As can be seen from FIG. 2, at low gains the application of shunt feedback has significantly improved the input third-order intercept point. Over the $V_{AGC}$ range of 1.8 to 2.0V (corresponding to a gain control range of 3 to 4 dB), the amplifier with shunt feedback shows an improvement in IIP$_3$ of 3 to 5 dB compared to that of the amplifier without feedback.

Because the shunt feedback network is connected to the output resistor chain at node Y rather than node Z, the amplifier only experiences light feedback at the highest gain. As a result, the shunt feedback network only contributes slightly to the input noise at high gain, allowing a low noise figure at high gain. Since both the signal and noise currents of the transconductance stage are injected into the same node in the loading network, the output SNR and noise figure of the LNA are only modestly degraded as the gain is reduced.

Figure 3:
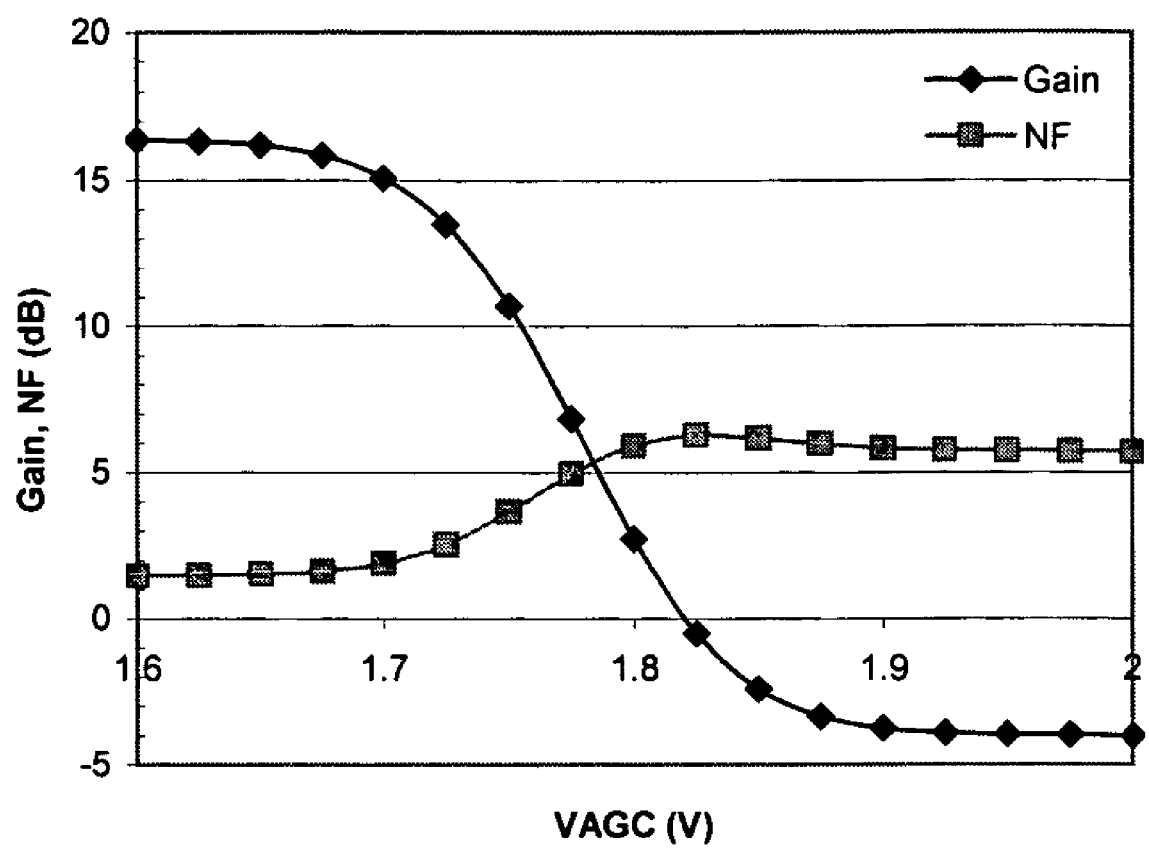
FIG. 3 shows a graph illustrating the gain and noise figures versus gain control voltage of the variable-gain LNA of FIG. 1.

FIG. 3 shows the gain and noise figures at 2 GHz versus $V_{AGC}$ of the LNA in accordance with the present invention. The LNA achieves noise figures of 1.5 and 5.7 dB at gains of 16 and −4 dB, respectively.

The present invention includes an LNA that provides continuously variable gain along with high-performing noise and linearity characteristics, and achieves other characteristics wanted in an LNA. Since a shunt feedback network connects the input of the LNA to an intermediate node of a loading network rather than the output, excellent reverse-isolation characteristic of the cascode amplifier is preserved. The output impedance is independent of gain because it only depends on the impedance seen at node Z. By properly choosing the size of input device $Q_1$, the value of $R_f$, the current through $Q_1$, and the value of emitter inductor $L_{E2}$, the input impedance only changes slightly as the gain is varied.

The present invention includes an LNA with continuously variable gain. The embodiments described above are illustrative of the present invention and are not intended to limit the scope of the invention to the particular embodiments described. Accordingly, while several embodiments of the invention has been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. An amplifier comprising:
   means for an input inductively degenerated transconductance stage;
   means for a current-steering circuit coupled to the means for an input inductively degenerated transconductance stage;
   means for an output-loading network coupled to the means for a current steering circuit; and
   means for a shunt feedback network directly coupled between the means for an output-loading network and an input of the means for an input inductively degenerated transconductance stage.

2. A continuously variable-gain LNA, comprising:
   means for a transconductance stage that receives an input signal to be amplified;
   means for a current steering circuit coupled to the means for a transconductance stage;
   means for an output circuit coupled to the means for a current steering circuit that outputs an amplified version of the input signal; and
   means for a feedback circuit directly coupled between the means for an output circuit and an input of the means for a transconductance stage.

3. The LNA of claim 2, wherein the means for a transconductance stage is a means for an inductively degenerated transconductance stage and comprises a first transistor and an inductor, wherein the inductor is coupled to a system ground and the first transistor is coupled to the current steering circuit.

4. The LNA of claim 2, wherein the means for a current steering circuit comprises:
   a first transistor coupled to a reference signal; and
   a second transistor coupled to a gain control signal and the first transistor.

5. The LNA of claim 2, wherein the means for a feedback circuit comprises a resistive element coupled between the output circuit and the input to the transconductance stage.

6. The LNA of claim 5, wherein the resistive element comprises a resistor and the feedback circuit further comprises a capacitive element coupled in series with the resistor.

7. The LNA of claim 2, wherein the means for an output circuit comprises a resistor pair having a common node.

8. The LNA of claim 7, wherein the means for a feedback circuit is coupled to the common node.

9. The LNA of claim 8, wherein the means for a current steering circuit is coupled to the common node.

10. The LNA of claim 7, wherein a first resistor of the resistor pair is coupled to the output.

* * * * *